United States Patent [19]

Depey

[11] Patent Number: 4,550,491
[45] Date of Patent: Nov. 5, 1985

[54] METHOD OF MAKING SUBSTRATE INJECTION LOGIC OPERATOR STRUCTURE

[75] Inventor: Maurice Depey, Paris, France

[73] Assignee: Thomson CSF, Paris, France

[21] Appl. No.: 677,885

[22] Filed: Dec. 3, 1984

Related U.S. Application Data

[63] Continuation of Ser. No. 261,935, May 8, 1981, abandoned.

[30] Foreign Application Priority Data

May 12, 1980 [FR] France ................. 80 10566

[51] Int. Cl.$^4$ ........................................ H01L 21/74
[52] U.S. Cl. ................... 29/577 C; 148/1.5; 148/175; 148/190; 29/576 B; 29/576 E; 29/578; 357/92
[58] Field of Search ........ 148/1.5, 175, 190; 29/576 B, 576 E, 577 C, 578; 357/35, 44, 92

[56] References Cited

U.S. PATENT DOCUMENTS

| | | | |
|---|---|---|---|
| 3,913,123 | 10/1975 | Masaki et al. | 357/34 |
| 4,087,900 | 5/1978 | Yiannoulos | 29/578 |
| 4,106,049 | 8/1978 | Shinozaki et al. | 357/46 |
| 4,110,126 | 8/1978 | Bergeron et al. | 148/1.5 |
| 4,228,448 | 10/1980 | Lalumia et al. | 357/46 |
| 4,240,846 | 12/1980 | Doyle | 148/175 |
| 4,258,379 | 3/1981 | Watanabe et al. | 357/44 |
| 4,272,307 | 6/1981 | Mayrand | 148/187 |

Primary Examiner—Aaron Weisstuch
Attorney, Agent, or Firm—Cushman, Darby & Cushman

[57] ABSTRACT

An SFL operator and process for its manufacture. The operator is manufactured from a low-doped P-type substrate on which are successively implanted a highly-doped P-type layer and a highly-doped N-type layer. Below a metallic collector contact of the NPN transistor of the SFL operator, the structure successively comprises an epitaxial N-layer, an average-doped R-type layer and a highly-doped N-type layer. This structure is compatible with the manufacturing on the same silicon chip of both SFL operators and classical linear bipolar transistors.

6 Claims, 13 Drawing Figures

METHOD OF MAKING SUBSTRATE INJECTION LOGIC OPERATOR STRUCTURE

This is a continuation of application Ser. No. 261,935, filed May 8, 1981, now abandoned.

BACKGROUND OF THE INVENTION

The present invention relates to a substrate injection logic (SIL) operator structure of the substrate-fed logic type and a process for its manufacture and more particularly to such a structure and such a manufacturing process which are compatible with the formation on the same integrated circuit wafer of conventional bipolar-type components.

FIG. 1 schematically illustrates an I²L logic operator structure (abbreviation of the term Integrated Injection Logic). As is well known, this structure is generally formed on a P-type substrate 1 overlaid with an N-type buried layer 2 and an epitaxial layer 3 also of N-type but with a lower doping level than that of N-type buried layer 2. In the epitaxial layer 3 there are formed at least two distinct P-type zones 4 and 5. Inside P-type zone 5 are formed several N-type zones 6. An injector metalization I is integral with zone 4, a base metalization B is integral with zone 5 and collector metalizations $C_1$, $C_2$ . . . are integral with zones 6. An emitter metalization E is integral with N-type layer 3 or, as is shown, with high-doping-level N-type zones joining the buried layer 2. As is known, this structure is equivalent to the association of a first NPN logic transistor 10 and a second injector transistor 11. FIG. 1 shows which layers form the emitter, the base and the collector of each of these transistors 10 and 11.

Among the numerous advantages of the I²L technology, a significant advantage is that it is compatible with conventional technology for construction of bipolar transistors. Thus, there may be formed on the same P-type substrate 1, provided with adjacent highly doped buried layers 2 localized or not and with an epitaxial layer 3 with lower doping level, in separate positions on the same integrated circuit wafer, conventional bipolar transistors and I²L logic circuits.

FIG. 2 shows an alternative structure for an I²L type logic circuit in which the injection takes place through the substrate. This technology is currently designated in the art by the initials SFL (abbreviation of the term Substrate Fed Logic). In FIG. 2, the same reference numerals as in FIG. 1 have been used where possible to designate identical or corresponding layers. The main difference between the structures of FIGS. 1 and 2 is that the injector transistor 11 is vertical instead of being lateral. Its emitter instead of being formed by a layer 4 formed in the surface of the N-type epitaxial layer 3 is now formed by the P-type substrate 1. This SFL technology has an advantage with respect to the conventional I²L technology. This advantage is the capability of greater miniaturization since zone 4 which must be formed on the surface of the conventional I²L structure (FIG. 1) as well as the N-type zone separating zone 4 from zone 5 are not required in the SFL structure (FIG. 2).

Nevertheless, this SFL technology has not been used in many practical applications because of the significant technological difficulties in putting in into practice. Consider the N-type zone (including layers 2 and 3) separating the P-type substrate 1 from P-type layer 5. This zone must have both a relatively high doping level in the vicinity of the substrate 1 and a relatively low doping level in the vicinity of its interface with layer 5. Furthermore, the P-type substrate layer 1 at the interface with the N-type zone (layers 2 and 3) must have a high doping level. This has led to the use in the art of heavily doped (more than $5 \times 10^{18}$ at/cm³) P-type substrates. This use of P-type substrates with a high doping level has a significant disadvantage. It is difficult to dope the front face of the substrate because of the self-doping parasite phenomena related to exo-diffusions from the rear face. It is also difficult to make the SFL technology compatible with the technology for manufacturing conventional bipolar transistors which uses relatively low-doped substrates (of the order of $10^{15}$ at/cm³) rather than the high-doped substrate.

There have been different attempts in the prior art to form structures of the type shown in FIG. 2. There are those which included forming layer 2 from a layer buried in a P⁺-type substrate, then forming N-type layer 3 and P-type layers 5 by successive epitaxies. Another attempt included forming N-type layers 2 and 3 by successive epitaxies, then forming P-type layer 5 by localized diffusion. These processes have proven to be very complex, and do not provide entirely satisfactory results and do not ensure compatibility with conventional bipolar technologies. In the present state of the art, it is not possible to form, on an industrial basis, expitaxied layers localized and limited to positions on an integrated circuit chip formed in accordance with SFL technology logic circuits.

SUMMARY OF THE INVENTION

Thus, one object of the present invention is to provide a novel process for manufacturing substrate-fed logic operators (SFL).

Another object of the present invention is to provide such a manufacturing process that is compatible with the simultaneous manufacturing of junction-isolated bipolar components disposed on the same integrated circuit chip (using a common substrate).

Yet another object of the present invention is to provide a novel SFL-type logic operator structure obtained by the above-mentioned processes.

To attain these objects and others, the present invention provides a novel substrate-fed logic operator structure (SFL) including a P-type low-doped substrate. The structure includes successively, from the substrate, and under the zones corresponding to each collector of the NPN transistor of the operator:

a first P-type layer with high doping concentration resulting from a boron implantation in the substrate;

a second N-type layer with high doping concentration resulting from a phosphorus implantation in the first implantation;

a third N-type layer with low doping concentration resulting from an epitaxy;

a fourth P-type layer with average doping concentration resulting from a boron diffusion in the epitaxied layer; and a fifth N layer with high doping concentration resulting from a diffusion.

The process of manufacturing the above structure will be described after an exposition of its characteristics. One advantage of this process is that it allows bipolar-type transistors to be formed simultaneously on the same wafer. For this, the successive implanted layers of boron and phosphorus are only provided at the places where the implantation of an SFL-type logic structure is to occur. In the places where conventional bipolar-type structures are to be formed, an N-type buried layer is formed by implantation or diffusion of antimony, a localized over-implantation of phosphorus being formed inside this implantation of antimony at the places where it is desired for the buried layer to rise higher so that it joins diffusions made from the surface of the device to provide a connection with relatively good conductivity with the buried layer.

A significant aspect of the present invention relates to the choice of the combination of the dopants intended to form successive layers. These dopants are chosen based on the densities at which they may be implanted or diffused and on their relative diffusion speed. In fact, because of the large number of heating steps required by the process of the present invention, it is important to control the rapidity of diffusion of dopants. A deeply implanted dopant should not be diffused more rapidly than another dopant implanted less deeply because during a long diffusion, the deeper dopant would diffuse beyond the less deep dopant to create a zone of an undesirable type of conductivity (ghost layer). Alternative embodiments of the present invention may be achieved by modifying the dopant elements chosen. It is advisable to make sure that the same relationships exist between the diffusion speeds of these other dopants.

DESCRIPTION OF THE DRAWINGS

These above-listed objects, characteristics and advantages of the present invention as well as others will be discussed in more detail in the following description of particular embodiments, with reference to the accompanying figures in which.

As is customary in the field of semiconductors, the figures are not to scale and some of the dimensions have been expanded with respect to others so as to facilitate readability and understanding.

DETAILED DESCRIPTION OF THE PREFERRED EMBODIMENTS

Figure 3:
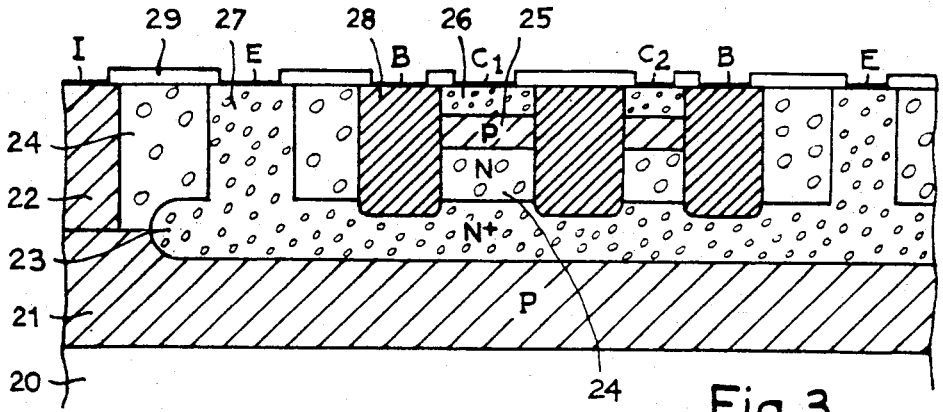
FIG. 3 shows an example of an SFL structure in accordance with the present invention.

FIG. 3 schematically shows a substrate-fed logic operator (SFL) in accordance with the present invention. This operator is formed on a P-type substrate 20 having a low doping level, for example between $10^{15}$ and $10^{16}$ at/cm$^3$, i.e. compatible with bipolar technology. On substrate 20, there is formed a P-type layer 21 with a higher doping level than that of the substrate, resulting from the exo-diffusion of a layer initially implanted in the substrate. The connection between this layer 21 and the surface of the device with which an injection electrode I is integral is provided by a diffused wall 22. Above layer 21 there is an N-type layer 23 having a high doping level (greater than $10^{18}$ at.cm$^3$). An N-type epitaxial layer 24 with low doping level, for example of the order of $10^{16}$ at/cm$^3$, then covers the entire device. In this epitaxial layer 24 there are formed successively, by diffusion, a P-type layer 25 with low doping level, (less than $10^{17}$ at/cm$^3$), and an N type layer 26 with very high doping level (for example higher than $10^{20}$ at/cm$^3$). An emitter electrode E for the NPN transistor is disposed above a zone where there is formed a heavily doped N-type deep diffusion 27 joining the buried layer 23. Base metalizations are formed on P-type deep diffusion regions 28. These deep diffusions are indicated as penetrating partially into the buried layer 23. In fact, their essential role is to provide conduction between the base electrode B and layer 25. Their excess depth results from the fact that they are formed, as will be seen hereafter, at the same time as walls 22, which economizes manufacturing steps without adversely affecting the quality of the device. Finally, collector electrodes $C_1$, $C_2$ are formed above N type surface zones 26. Reference numeral 29 designates an insulating layer, for example an oxide layer shown very schematically.

Figure 1:
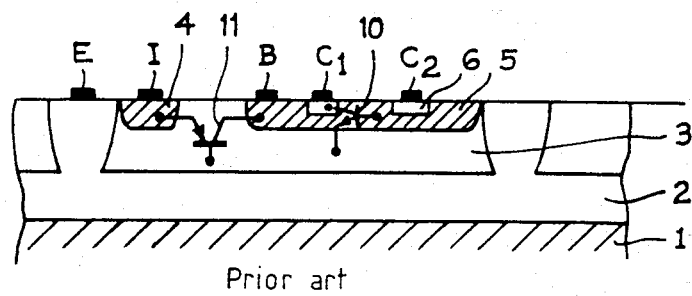
FIG. 1 shows a conventional I$^2$L type structure (this figure has already been described above)
Figure 2:
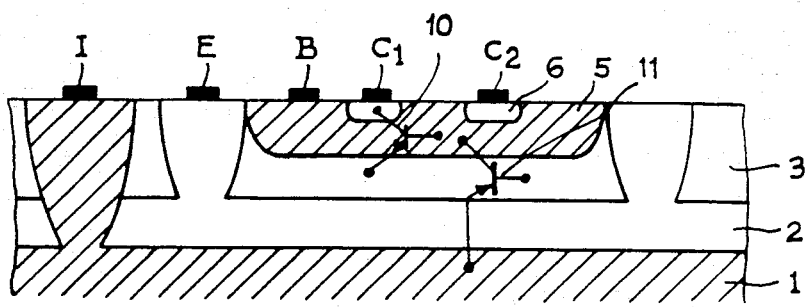
FIG. 2 shows a conventional SFL-type structure (this figure has already been described above)

FIGS. 4 to 12 schematically illustrate successive manufacturing steps for forming on the same P-type substrate, a conventional bipolar technology transistor in the left-hand part of the Figures (under the bracket A) and an SFL-type logic operator in the right-hand part of the figures (under the bracket B). Corresponding layers and regions will be designated by the same reference numerals in FIGS. 4–2 even though the corresponding regions and layers may not strictly have the same configuration from figure to figure, particularly because their dimensions increase by diffusion during the different heating steps. Furthermore, there will be used as much as possible for FIGS. 4 to 12 the same reference numerals as were previously used in FIG. 3.

Figure 4:
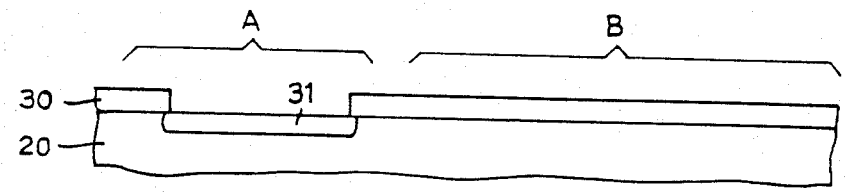
FIGS. 4 to 12 show successive steps for manufacturing an SFL structure and a conventional bipolar structure on the same substrate in accordance with the present invention.

FIG. 4 shows a P-type substrate 20 with a doping level of the order of $10^{15}$ at/cm$^3$. This substrate is coated with a silicon oxide masking layer 30 in a window of which there is formed by diffusion of antimony (Sb) an N-type region 31 intended to serve as a buried foundation for a linear bipolar-type structure.

Figure 5:
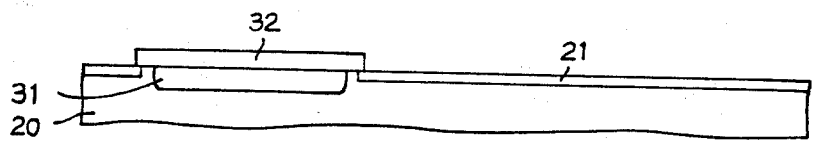

In the step shown in FIG. 5, a masking layer 32 is disposed above N-type layer 31 and an implantation of boron is carried out in the substrate to provide a P-type layer 21 with high doping level. Between these two steps there takes place annealing of the buried antimony layer 31 for example at 1260° C. for 3 hours in a nitrogen atmosphere. The boron implantation 21 may be, for example, carried out under the effect of a voltage of 180 kV and at doses on the order of $10^{15}$ at/cm$^2$.

Figure 6:
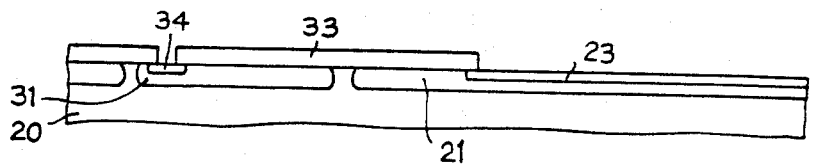

In the step of FIG. 6, a new masking layer 33 is formed on the substrate. This mask is open above a limited location of layer 31 and above a wide portion of layer 21 so as to form there implanted layers 34 and 23. This implantation may also take place under the effect of an accelerating voltage of 180 kV with a density of $2 \times 10^{14}$ to $10^{15}$ at/cm$^2$.

Figure 7:
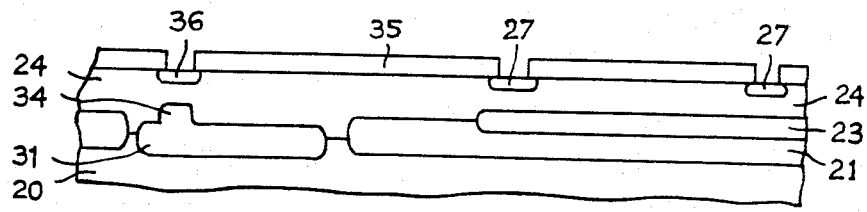

As shown in FIG. 7, after annealing of the implantations, growth of an N-type epitaxial layer 24 with low doping level is initiated. This epitaxial layer may for example have a thickness on the order of 3 to 5 microns and a resistivity of the order of 1.5 to 4 ohms/cm. On the epitaxial layer there is formed, after different annealing steps, a mask 35 open at the locations such as shown in the figure, under which it is desired to form N$^+$-type walls joining the N-type deep-buried layers 23 and 4. In this connection, it will be noted that the phosphorus implantation 34 which has a higher diffusion rate than the antimony implantation 31, presents an upwardly projecting part after the heat diffusion steps. In the windows of mask 35 there are formed by diffusion of phosphorus (for example from POCl₃) N⁺-type regions 36 and 27, regions 36 being opposite region 34.

Figure 8:
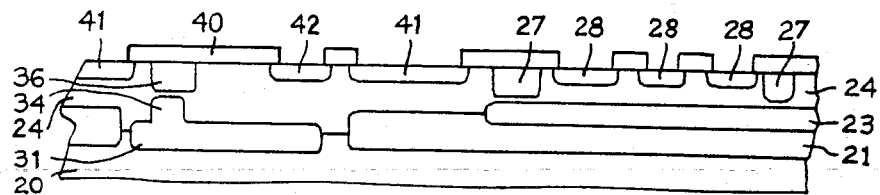

In the step of FIG. 8, a mask 40 is formed on the substrate, this mask comprising windows in which boron is diffused. The zones for forming the insulating walls joining the P⁺-tye deep-buried foundations 21 are designated by the reference 41; the zones serving as base for the bipolar transistors are designated by the reference 42; and the zones serving as base contact for the NPN transistors of the SFL operators are designated by the reference 28. During the different heating steps, it will be noted that zones 27 and 36 illustrated in FIG. 7 become deeper and tend to join up with the opposite zones 23 and 34 respectively.

Figure 9:
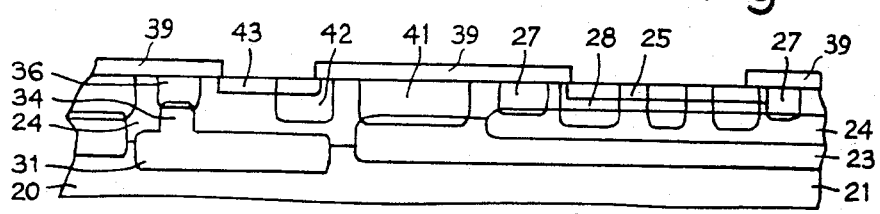

In the step shown in FIG. 9, the formation of the P-type base zones is initiated by implantation of boron through a masking layer 39 at a relatively low density, for example with an energy of 180 keV and a density of $2 \times 10^{13}$ at/cm². These base zones are designated by reference numeral 43 for the linear bipolar transistors and by reference numeral 25 for the NPN transistors of the SFL operators.

Figure 10:
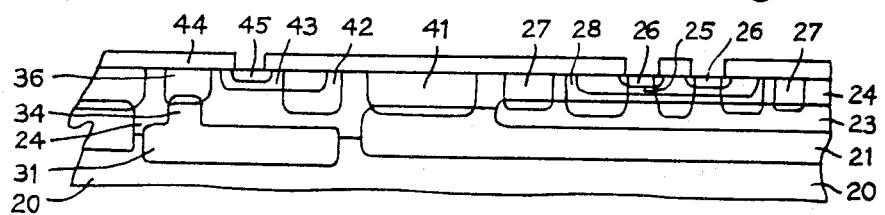

In the step shown in FIG. 10, a mask 44 is used for forming the N-type emitter zones of the bipolar transistors and the collector zones of the NPN transistor of the SFL operators. This may be achieved by diffusing posphorus from POCl₃ followed by an annealing step or else by diffusion of arsenic. Thus is obtained an emitter zone 45 for the normal bipolar transistors and collector zones 26 for the SFL-type operators.

Figure 11:
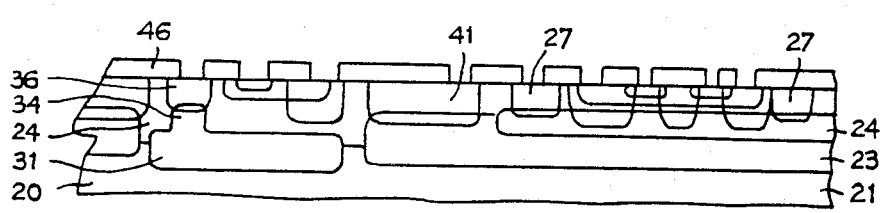
Figure 12:
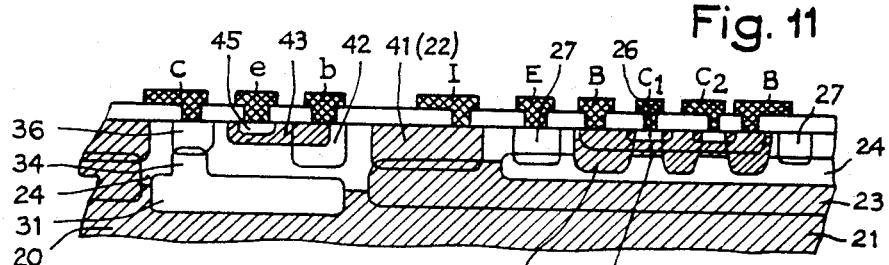

FIG. 11 shows a step for forming a mask 46 in which windows are open at the location where it is desired to deposit metalizations on the semiconductor. These metalizations are shown in FIG. 12. The collector, emitter and base metalizations c, e, b of the normal bipolar transistors and the I, E, B, C₁, C₂ metalizations of the SFL-type operator may be seen.

In FIG. 12, as in the preceding FIG. 3, the zones corresponding to P-type dopings are shown with hatching.

Figure 13:
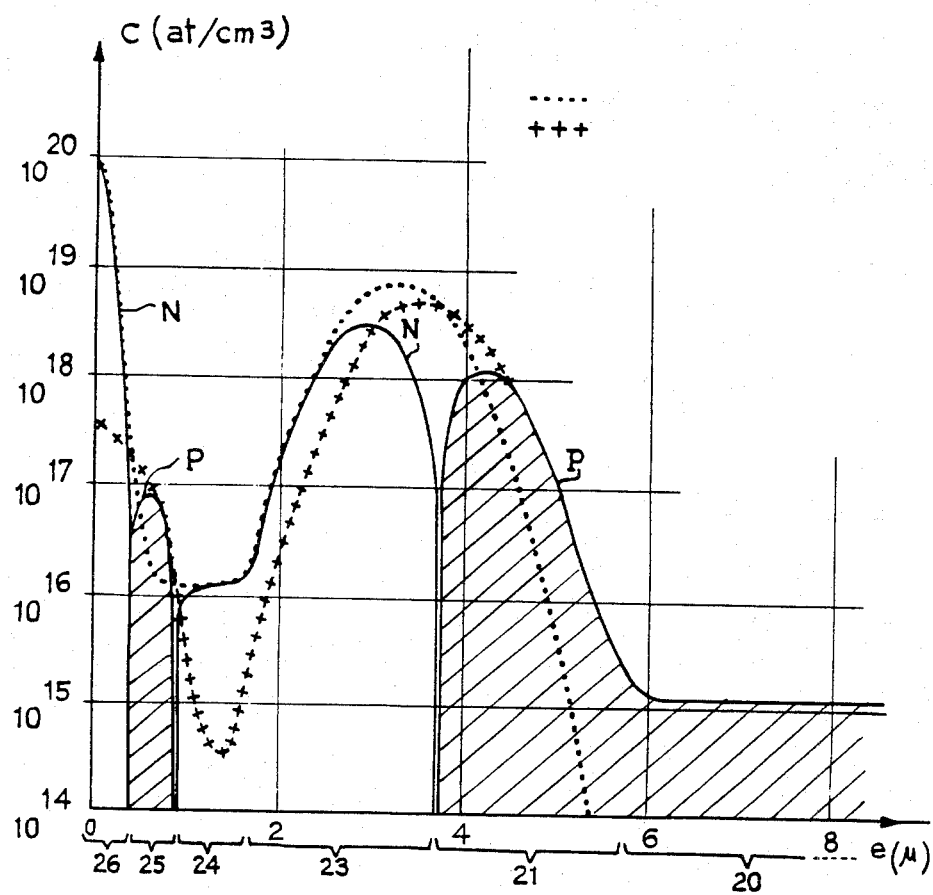
FIG. 13 shows dopant impurity concentration profiles in a structure in accordance with the present invention.

FIG. 13 is a graphical presentation having as an ordinate dopant concentration C in at/cm³ (logarithmic scale) and as an abscissa the thickness e in microns of silicon from the surface. This figure shows by way of nonlimiting example doping profiles at right angles to collectors C₁ and C₂ of the SFL structure, which may be obtained by the manufacturing process in accordance with the present invention. There is shown as abscissa the corresponding layers 26, 25, 24, 23, 21 and 20. It will be noted in this connection that the notion of "layer" is relatively arbitrary. In fact, it is difficult to say, for example, that zones 24 and 23 form distinct layers since it is a question of an N zone with variable concentration profile. Nevertheless, this term has been kept here because of its customary and simplifying character. In FIG. 13, the different full-line curves shown the net concentration profiles corresponding to the different zones. The resulting P-type zones have been shown by hatching. The dotted curve shows the phosphorus concentration for the different depths and the curve formed by successive crosses shows the boron concentration depending on the depth. Of course, when the phosphorus doping is higher than the boron doping, a type N layer is obtained and in the opposite case a P-type layer. It will be noted that, in the example shown, the epitaxied layer has a thickness on the order of 4 microns.

While the invention has been described in connection with what is presently considered to be the most practical and preferred embodiment, it is to be understood that the invention is not to be limited to the disclosed embodiments but on the contrary, is intended to cover various modifications and equivalent arrangements included within the spirit and scope of the appended claims which scope is to be accorded the broadest interpretation so as to encompass all such modifications and equivalent structures.

What is claimed is:

1. A process for manufacturing a substrate-fed logic operator, including a PNP injection transistor and an NPN multicollector transistor on a semiconductor wafer, comprising the steps of:
   (a) providing a low-doped P-type substrate,
   (b) boron implanting the substrate through a first masking layer to form a first P-type layer with high doping concentration,
   (c) phosphorus implanting the substrate through a second masking layer covering part of the first P-type layer to form a second N-type layer having a high doping level, and annealing the wafer,
   (d) forming, by epitaxy, a third N-type layer having a low doping level and overlying all previous layers,
   (e) phosphorus diffusing the epitaxial third layer through a third masking layer to subsequently form an emitter access to the second N-type layer through said epitaxial third layer, and annealing,
   (f) boron diffusing the third epitaxial layer through a fourth masking layer, to form a fourth P-type layer of high doping level, corresponding to base contacts and separation between collectors of said NPN multicollector transistor, said fourth layer subsequently diffusing down to said second layer,
   (g) boron implanting said third epitaxial layer through a fifth masking layer to form a fifth P-type layer of intermediate doping level, corresponding to the base of said NPN multicollector transistor,
   (h) introducing an N-type impurity in the epitaxial third layer through a sixth masking layer to form a sixth N-type layer of high doping level corresponding to collector regions of said NPN multicollector transistor, and
   (i) forming metal contacts with said emitter access, with said fourth layer and with said sixth layer.

2. A process according to claim 1, for manufacturing a substrate-fed logic operator together with single collector NPN bipolar vertical transistors on a single substrate, further including, before step (b), the step of diffusing antimony in the substrate through a seventh masking layer which covers said logic operator, and wherein said first masking layer covers said single collector NPN bipolar vertical transistors and said second masking layer covers the single collector NPN transistors except above a collector access to the antimony doped layer.

3. A process according to claim 2, wherein step (e) comprises the step of diffusing phosphorus into said collector accesses to the antimony doped layer.

4. A process according to claim 2, wherein step (f) comprises the step of diffusing boron into base contacts for the single collector NPN bipolar transistor.

5. A process according to claim 2, wherein step (g) comprises the step of implanting boron into base regions for the single collector NPN bipolar transistors.

6. A process according to claim 2, wherein step (h) comprises the step of introducing an N-type impurity into emitter regions for the single collector NPN bipolar transistors.

* * * * *